United States Patent
Ivanov et al.

(10) Patent No.: US 6,194,739 B1
(45) Date of Patent: Feb. 27, 2001

(54) INLINE GROUND-SIGNAL-GROUND (GSG) RF TESTER

(75) Inventors: Tony G. Ivanov; Michael Scott Carroll, both of Orlando, FL (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/448,521

(22) Filed: Nov. 23, 1999

(51) Int. Cl.$^7$ .......................... H01L 23/58; H01L 23/544; H01L 21/66; G01L 31/26
(52) U.S. Cl. .............................. 257/48; 257/620; 438/14; 438/17; 438/18
(58) Field of Search .................. 438/18, 14, 15, 438/17, 129; 257/48, 620

(56) References Cited

U.S. PATENT DOCUMENTS

| | | |
|---|---|---|
| 3,849,872 | 11/1974 | Hubacher . |
| 5,059,899 | 10/1991 | Farnworth et al. . |
| 5,206,181 | 4/1993 | Gross . |
| 5,214,657 | 5/1993 | Farnworth et al. . |
| 5,477,062 | * 12/1995 | Natsume ................................. 257/48 |
| 5,504,369 | 4/1996 | Dasse et al. . |
| 5,523,252 | * 6/1996 | Saito ..................................... 437/51 |
| 5,903,489 | * 5/1999 | Hayano ................................. 365/51 |
| 5,942,766 | 8/1999 | Frei . |

OTHER PUBLICATIONS

Schmukler, B. C., "Coplanar on–wafer matching structures tunable by RF–probe position", Microwave Symposium Digest, 1994., IEEE MTT–S International, pp. 1481–1484 vol. 3, May 23–27, 1994.*

U.S. application No. 09/243,377, Carroll, filed Feb. 1, 1999.

* cited by examiner

Primary Examiner—Matthew Smith
Assistant Examiner—Lex H. Malsawma
(74) Attorney, Agent, or Firm—Duane, Morris & Heckscher LLP

(57) ABSTRACT

A wafer configured for in-process testing of electrical components has a plurality of dies disposed on the wafer, wherein adjacent dies are separated from one another by streets. An in-line device monitor having a first port, a second port, and a device-under-test substantially in line with one another is placed within a street, where the device-under-test is between the first and second ports and is electrically coupled to the first and second ports. With such an arrangement, streets having a width of 100 microns and less are suitable for accomodating a RF-device monitor having ground-signal or ground-signal-ground configurations. As a result, accurate GS or GSG RF-device monitors can be provided in narrow streets of wafers, thereby increasing the amount of wafer area available for circuitry.

27 Claims, 5 Drawing Sheets

500

INLINE GROUND-SIGNAL-GROUND (GSG) RF TESTER

BACKGROUND OF THE INVENTION

1. Field of the Invention

The present invention relates to in-process electrical testing of integrated circuit (IC) components and, in particular, to GSG RF testers.

2. Description of the Related Art

Semiconductor integrated circuits (ICs) are typically formed in a manufacturing or fabrication process on semiconductor substrates. Silicon wafers are typically employed to provide a common substrate for the components of the ICs. Several ICs (also called dies or chips) are usually formed in each wafer, which is a very thin, flat disc typically about 5–12" in diameter at the present time. During the manufacturing process, impurities are diffused into each silicon wafer to create transistors and other electronic components of the respective ICs of the wafer. The fabricated components are then interconnected through deposited metal layers to form logic or other functions. Once the wafer is completely processed, it is cut up (diced) into the individual die (chips), which are typically about 5 mm by 5 mm in size. Each die is mounted in a package and the terminals of the chip are connected to the package terminals through a wire bonding operation.

The ICs formed on semiconductor substrates, such as silicon wafers, typically comprise a variety of basic electrical components, such as amplifiers, resistors and the like. The various dies or ICs formed on the wafer are typically arranged in a grid pattern and are thus separated by vertical and horizontal "streets." It is desirable to verify that such integrated basic components are fabricated according to a design specification and have certain properties or values, e.g., a specified gain, resistance, etc. An individual component cannot readily be tested, however, once integrated into a circuit.

In lieu of testing the integrated components (i.e. the components that are part of the ICs on the wafer), "stand-alone" copies of such basic components are tested. The stand-alone copies are fabricated in some location of the surface of the wafer not occupied by the dies or ICs formed on the wafer, e.g. in the horizontal or vertical streets separating the ICs formed on the wafer. Such stand-alone copies or "target components" have properties or values of gain, resistance, and the like that are representative of such properties of their IC counterparts since they are fabricated using the same process. As such, it may be assumed that the parameters measured for the target components are similar to those of the non-tested integrated components, and it is therefore appropriate to apply the test results for the target components to the integrated components. Such a quality control methodology is referred to as "in-process electrical testing."

During in-process electrical testing, a signal source and measurement device, usually external, are electrically connected to the stand-alone target component to be tested, or DUT (device under test). Electrical connection is typically effected via microprobes, one of which is attached to an end of a coaxial cable carrying a signal from the signal source, and the other of which is attached to an end of a coaxial cable leading to the measurement device.

On the wafer, the target component is electrically connected to pads. The microprobes contact the pads, thereby electrically connecting the signal source and the measurement device to the target component. The measurement device is typically used to measure various response or performance parameters of the target component, i.e. parameters which characterize the response or performance of the target component.

The pads and the target component, collectively, form a "process monitor" or "device monitor," sometimes referred to as a "tester". Some of the wafer surface is typically reserved for such testers. This reserved surface cannot be utilized for devices forming part of the ICs, and, as such, reduces the amount of wafer surface available for the ICs. It is therefore desirable to reduce the amount of wafer surface sacrificed in conjunction with the use of such testers, and to improve the accuracy of such measurements for a given size tester.

SUMMARY

According to the present invention, a wafer configured for in-process testing of electrical components has a plurality of dies disposed on the wafer, wherein adjacent dies are separated from one another by streets. An in-line device monitor having a first port, a second port, and a device-under-test substantially in line with one another is placed within a street, where the device-under-test is between the first and second ports and is electrically coupled to the first and second ports. With such an arrangement, streets having a width of 100 microns and less are suitable for accomodating a RF-device monitor having ground-signal or ground-signal-ground configurations. As a result, accurate GS or GSG RF-device monitors can be provided in narrow streets of wafers, thereby increasing the amount of wafer area available for circuitry.

DESCRIPTION OF THE PREFERRED EMBODIMENT

RF-Device Monitors for In-Process Electrical Testing

Figure 1:
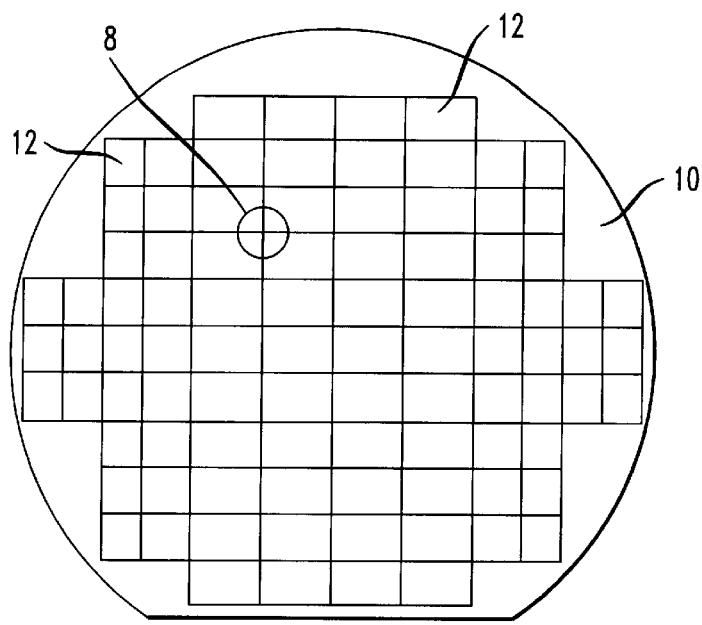
FIG. 1 shows a conventional prior art wafer having a plurality of dies arranged thereon.

Before describing the present invention, it is useful to discuss prior art wafers and the manner in which RF-device monitors are arranged thereon for in-process electrical testing. Referring now to FIG. 1, there is shown a conventional wafer 10 and a plurality of dies 12 formed thereon. The dies 12 are discrete regions of the wafer at which circuitry (the IC) is patterned. All dies resident on a wafer may contain the same circuitry, such as is typical for mass production of a particular IC, or each die in a plurality of such dies disposed on a single wafer may have a different circuit configuration from other dies on the wafer. Typically, the wafer is diced to separate the dies 12 for use. When separated, the individual dies are typically referred to as an IC or chip.

Figure 2:
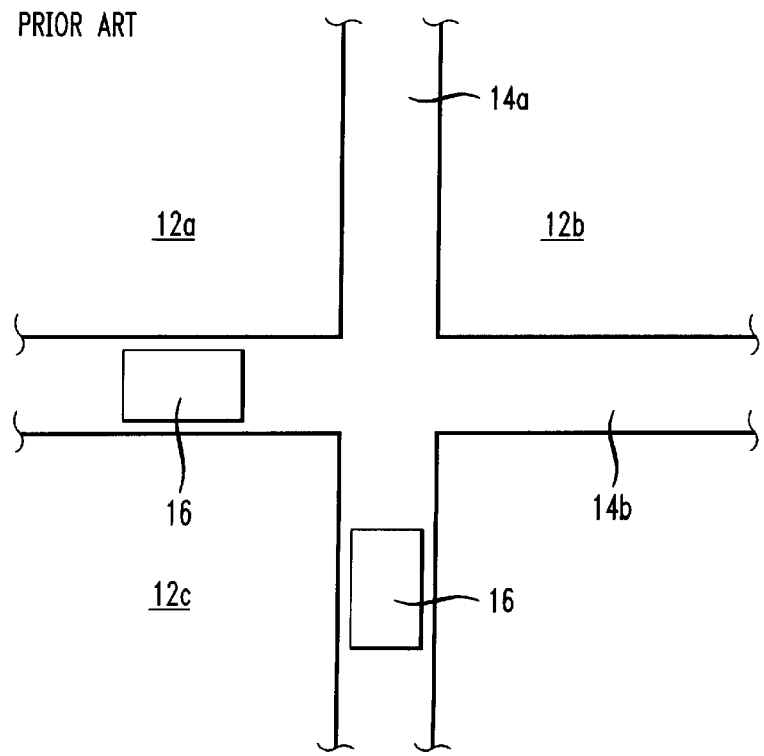
FIG. 2 is an enlarged view of a region of the wafer of FIG. 1, showing horizontal and vertical streets located between dies.

Referring now to FIG. 2, there is shown an enlarged view of region 8 of wafer 10 of FIG. 1. Adjacent dies, such as adjacent dies 12a and 12b, and adjacent 12a and 12c, are separated by respective vertical and horizontal streets 14a, 14b. Device monitors or testers 16 operable to test various stand-alone electrical components, counterparts of which stand-alone components are incorporated within the circuits comprising any of the dies 12 on wafer 10, are located in the streets between such dies, such as the streets 14a, 14b.

Device monitors can be classified according to their operating frequency range. One class of device monitors is suitable for DC or relatively low frequency measurements, such as below about 1 megaHertz (MHz). A second class of device monitors is suitable for high frequency, i.e., radio frequency (RF), measurements. RF testers can be of at least two types, so-called "ground-signal" (GS) configuration testers, and "ground-signal-ground" (GSG) testers. The second class of device monitors (RF-device monitors) is appropriate for measurements at frequencies as high as about 40 gigaHz (GHz) for GS type testers, and as high as about 60 GHz for GSG type testers. The former may be referred to as GS RF-device monitors or GS RF testers, and the latter as GSG RF-device monitors or GSG RF testers.

GS type RF testers typically require more space on the wafer than low frequency device monitors, and typically require less space than GSG RF testers. For example, a conventional wafer might utilize streets having a width of about 100 microns (micrometers, or $\mu$m) to accommodate low frequency device monitors, streets having a width of about 200 m for GS RF-device monitors, and streets having a width of about 300 $\mu$m or more for GSG RF-device monitors.

In conventional wafers, all RF-device monitors on a wafer are typically disposed in one of either the vertical streets or horizontal streets. Disposing all of the RF-device monitors only on one type of street (i.e., either vertical or horizontal) generally minimizes the area sacrificed to such monitors since the streets (vertical or horizontal) that do not accommodate the monitors can be narrower than those that do have such monitors fabricated therein. Alternatively, the latter types of device monitors may be placed outside streets in designated testing areas to avoid having such wide streets.

High frequency, i.e., RF, measurement of a stand-alone electrical component is performed by measuring power transfer between an input port an output port having a common ground. RF measurement typically employs the characteristic scattering parameters (S-parameters, sometimes also referred to as a scatter matrix). S-parameters are RF-related measurements used to measure and characterize the high-frequency response of the device under test. Typically, a number of frequency-dependent S-parameters are elements of a scattering matrix or S-matrix. S-parameters are used to describe a device or circuit as a black box.

In measuring S-parameters, power is injected into the input of the device (e.g., from the signal source microprobe), and a measurement is made (e.g., via the measurement device coupled to the other microprobe) of how much power is reflected back. In particular, the power injection causes an incoming wave (having a given amplitude and phase) on the transmission line to the target device, which incoming wave is "scattered" by the device and its energy is partitioned between all the possible outgoing waves on all the other transmission lines connected to the circuit or device.

The S-parameters are fixed properties of the (linear) circuit which describe how the energy couples between each pair of ports or transmission lines connected to the circuit.

Formally, S-parameters can be defined for any collection of linear electronic components, whether or not the wave view of the power flow in the circuit is necessary. They are algebraically related to the impedance parameters (z-parameters), also to the admittance parameters (y-parameters) and to a notional characteristic impedance of the transmission lines. For a device or circuit having two ports only, an input and an output, the S-matrix has four S-parameters.

Figure 3:
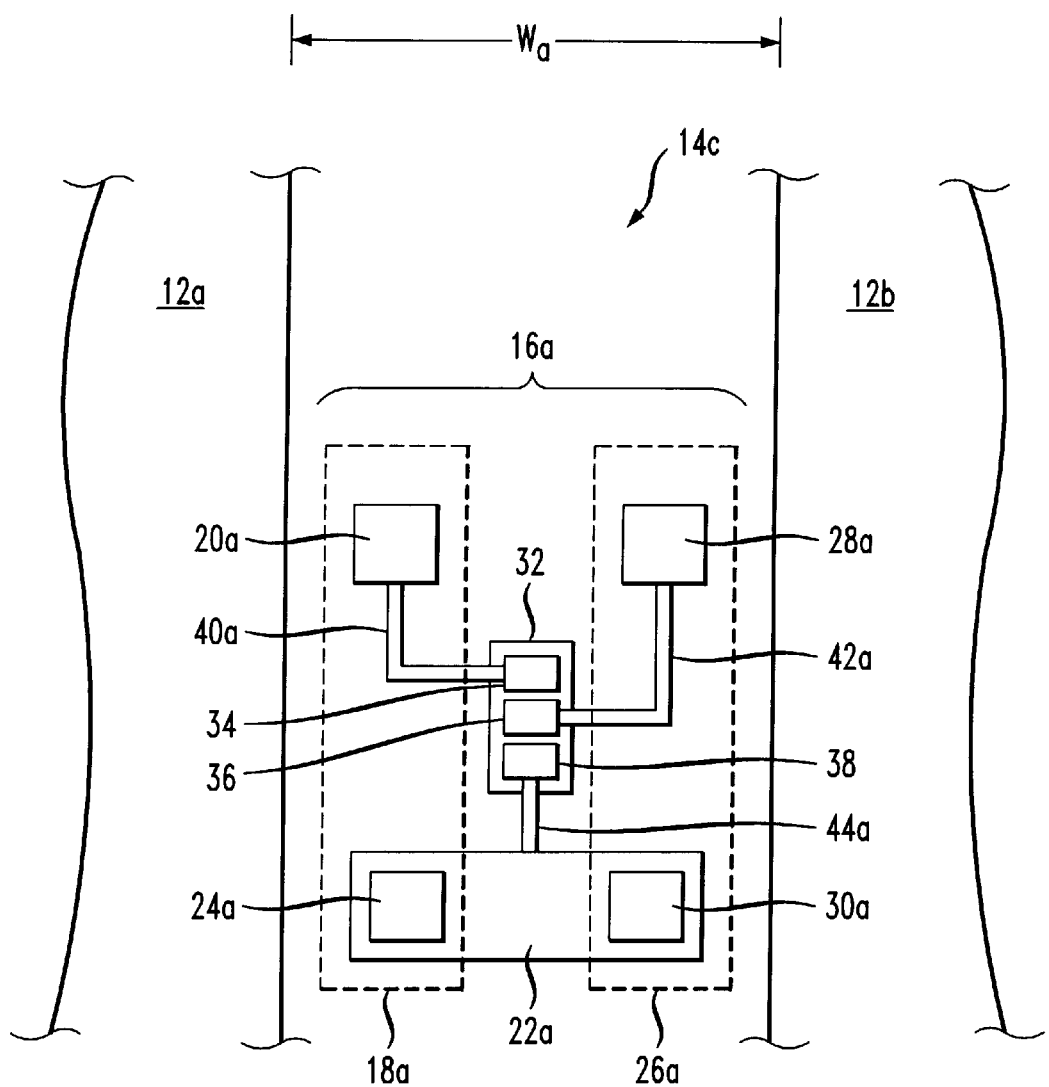
FIG. 3 shows a first prior art wafer with an RF-device monitor located in a vertical street between the dies.
Figure 3:
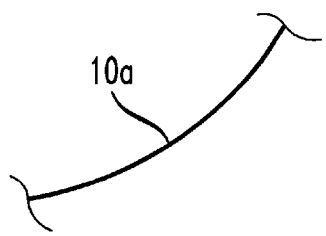

Referring now to FIG. 3, there is shown a portion of a conventional wafer 10a with GS RF-device monitor 16a disposed in vertical street 14c is shown in FIG. 3. The GS RF-device monitor 16a includes input port 18a and output port 26a. The input port 18a comprises an input signal pad 20a and input probe grounding region 24a of common ground 22a. The output port 26a comprises an output signal pad 28a and output probe grounding region 30a of common ground 22a. The input signal pad 20a, output signal pad 28a, and common ground 22a are discrete regions of conductive material, such as metal, disposed on the wafer 10a. Respective input and output probe grounding regions 24a and 30a are figurative or conceptual features of the common ground 22a. It is not necessary for such regions to be otherwise distinguishable from any other region of the common ground 22a.

GS RF-device monitor 16a further includes a target component 32 which is to be tested. Target component 32 may be any type of component that is incorporated into circuits residing on that wafer, such as a bipolar junction transistor (BJT). Typically, a plurality of device monitors such as device monitor 16a, each including a different target component 32, or including the same type of target component but each having a different characteristic value, e.g., gain, resistance, and the like, are disposed on the wafer 10a.

Target component 32 is connected to input and output ports 18a, 26a, as shown in FIG. 3. A first conductive trace 40a electrically connects a target component input 34 to the input signal pad 20a. A second conductive trace 42a electrically connects a target component output 36 to the output signal pad 28a. A third conductive trace 44a electrically connects a target component ground 38 to the common ground 22a. The target component input 34, output 36, and ground 38 represent terminals of the target component 32, e.g. collector, emitter, and base terminals, respectively, of a BJT.

Thus, the GS RF-device monitor 16a includes the input port 18a, output port 26a, target component 32, and the three conductive traces 40a, 42a, and 44a. As illustrated in FIG. 3, GS RF-device monitor 16a has a "co-planar" arrangement wherein the ground 22a and signal pads 20a, 28a are located on the same surface of the wafer 10a. The addition of a second ground on the other side of the signal pads 20a, 28a in FIG. 3 would provide a GSG configuration to the RF-device monitor.

To measure the target component 32, a high frequency signal source, such as a microwave generator and detector (not shown), are electrically connected to the target component 32 as follows. A first coaxial cable (not shown), carrying a high frequency signal from the high frequency signal source, is terminated by a first input "co-planar" microprobe (not shown). Co-planar microprobes suitable for use with GS RF-device monitors, such as monitor 16a, have two arms. One of the arms of the first microprobe contacts the input signal pad 20a, and the other arm contacts the input probe grounding region 24a. A second coaxial cable (not shown) is connected to the detector. The second coaxial cable is terminated by a second coplanar microprobe having two arms. One of the arms of the second microprobe contacts the output signal pad 28a and the other arm contacts the output probe grounding region 30a.

The input and output signal pads 20a, 28a are typically about 60–80 μm square. Typically, the approach distance between the first input and the second output microprobe, when in contact with the respective input and output ports 18a, 26a, should be at least about 100 μm to minimize electrical coupling therebetween. Allowing about 10–15 μm between the right edge of the die 12a and the left edge of the input signal pad 20a (and common ground 22a), and the same distance between the left edge of the die 12b and the right edge of the output signal pad 28a (and common ground 22a) requires a street width, $w_a$, of at least about 200 μm for the vertical street 14c.

RF-device measurement is prone to several sources of error, some of which have already been described. Additional sources of error include insertion losses due to the coaxial cable-microprobe connections, as well as reflections due to the impedance mismatches along the connection path. Accurate measurement requires low-loss, well-matched and reproducible connection between the measurement instrumentalities (high frequency signal source and detector) and the target device 32. Such error is minimized by proper dimensioning of the GS RF-device monitor, such as the monitor 16a, and further through the use of the appropriate co-planar microprobe. Such dimensioning, spacing and selection, some of which is quantified above, is within the capabilities of those skilled in the art. Co-planar microprobes suitable for use in conjunction with the present invention are available from Cascade Microtech, Inc. of Beaverton, Oreg. GGB Industries of Naples, Fla., among others.

Figure 4:
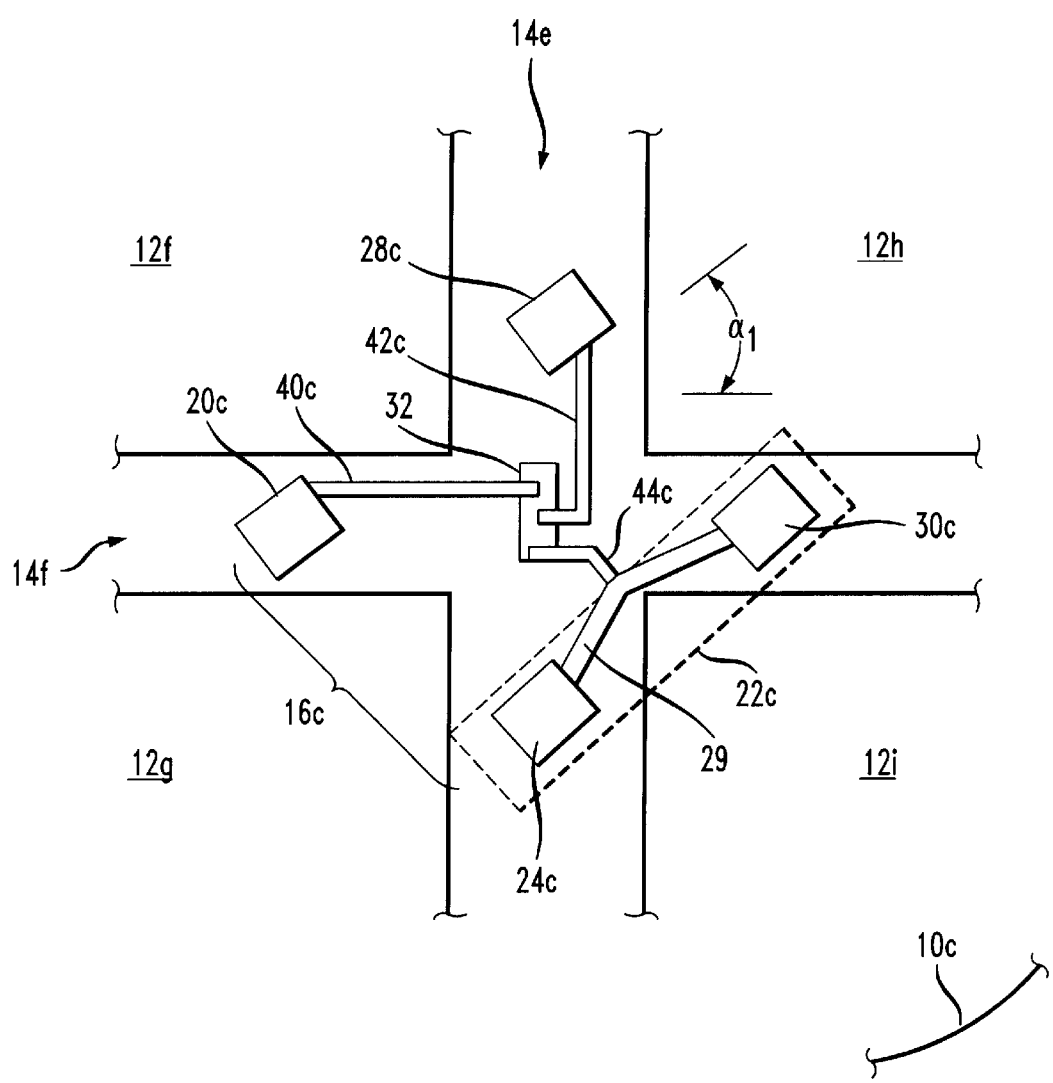
FIG. 4 shows a portion of an exemplary wafer in which a RF-device monitor having pads tilted 45 degrees is located partially in a vertical street and partially in a horizontal street.

Another technique for in-process testing is described in commonly-owned U.S. Pat. No. 5,942,766, issued Aug. 24, 1999, entitled "Article and Method for In-Process Testing of RF Products" (the '766 patent), the entirety of which is incorporated herein by reference. In the '766 patent, a wafer accommodates GS RF-device process monitors in streets having a width of only about 100 μm and less. While the GS RF-device monitors used in conjunction with the '766 patent may, in some embodiments, have a somewhat different configuration than monitor 16a used in conjunction with prior art wafers, they incorporate all the same elements as the device monitor 16a. The aforementioned reduction in street width is accomplished by locating a GS RF-device monitor at the intersection of two streets such that the monitor is partially in a first street and partially in a second street orthogonal to the first street, as further described in the '766 patent, and as illustrated in FIG. 4.

Therefore, using the "street corner" technique of the '766 patent, a GS RF-device monitor may be provided which can fit in streets as small as 100 μm in width. However, although the GS RF "street corner" tests can fit in streets as small as 100 μm, it still must be fit into the corners, thus limiting flexibility. Moreover, the GS RF testers described above are not a symmetrical tester structure as is a GSG structure, and thus do not provide as accurate a measurement as do symmetrical (GSG) RF testers. For this reason, GSG RF testers are often preferred, to obtain the highest accuracy in RF measurements. However, as noted above, such GSG testers tend to require even more space than other types of testers.

Figure 5:
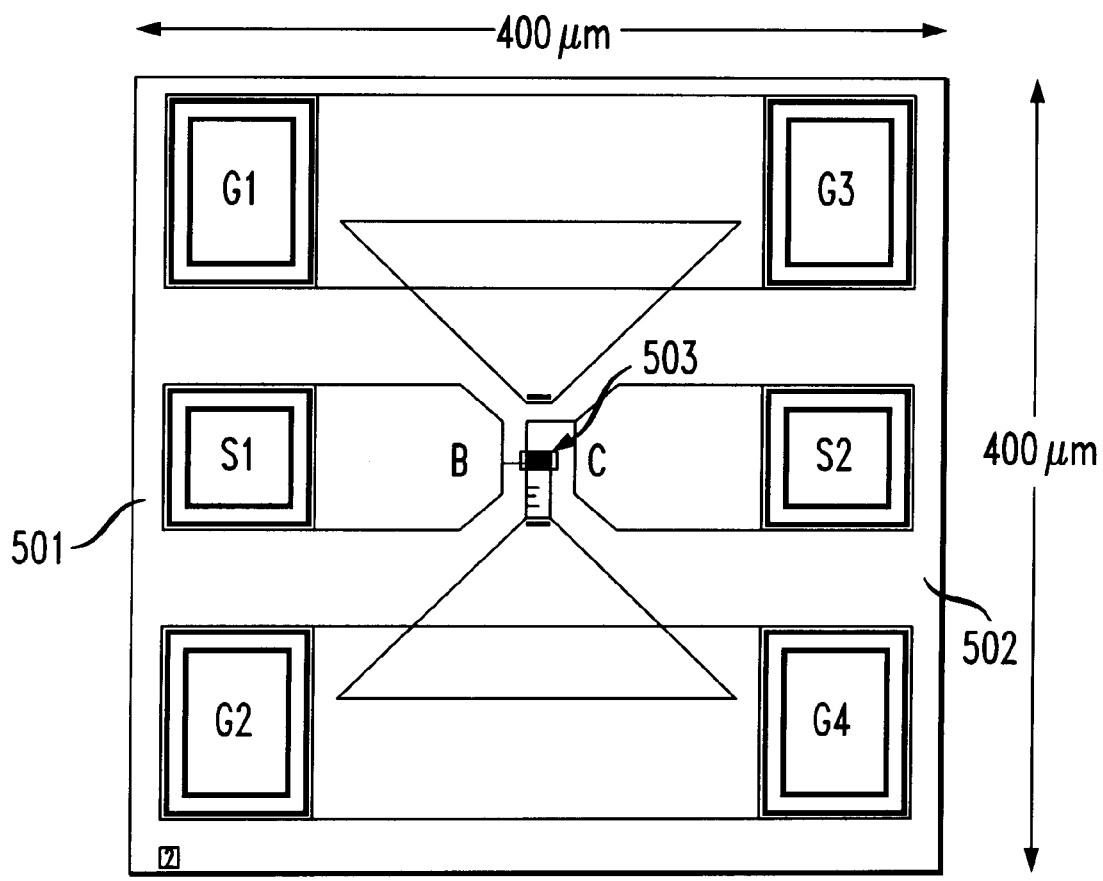
FIG. 5 shows a conventional GSG RF tester.

Referring now to FIG. 5, there is shown a conventional GSG RF-device monitor or tester 500. GSG RF-device monitor 500 comprises first port 501 (comprising three pads, G1, S1, G2, on the left), second port 502 (comprising three pads, G3, S2, G4, on the right), and target device under test (DUT) 503. Corresponding ground pads are coupled by metal lines, e.g. ground pad G1 is connected to ground pad G3, and ground pad G2 is coupled to ground pad G4, by respective metal lines, as illustrated. DUT 503 may be, for example, a bipolar junction transistor having base terminal B, collector terminal C, and emitter terminal E. Signal pad S1 is coupled by a metal line to the base terminal B, signal pad S2 is coupled to the collector terminal C, and the emitter terminal E is grounded by metal line connection to ground pads G2, G4.

Ground pads G1, G3 are not necessarily coupled to the DUT but are present for symmetry. This is needed due to the existence of the electromagnetic (EM) fields propagating to the DUT 503 from the microprobes. Each microprobe also has two ground pins and a signal pin in the center, so that the EM signal propagates in the gap between the signal metal and the ground metal of the coaxial cable. For a single-sided (GS) structure, e.g., the GS structure shown in FIG. 5, there is asymmetry in the test structure and in the probes and coaxial probe cables. The EM field propagating between the signal and ground pads are well-contained, but other fields on the other side of the signal pad will not be properly terminated in a ground pad, but will instead terminate in the silicon, or other structures of the wafer, thus giving rise to interference, errors, and reduced test accuracy. Thus, GSG symmetry in the test ports of an RF tester helps to ensure symmetrical EM fields and better EM field termination from the signal to the ground pads.

A GSG configured RF-device monitor such as GSG tester 500 can provide more accuracy and greater frequency range than GS RF testers, although GSG RF-device monitors typically require more space on the wafer than GS RF-device monitors. For example, conventional GSG RF-device monitor 500 is about 400×400 μm, while low-frequency device monitors and GS-configured RF-device monitors can be fabricated in a smaller space, thus permitting them to be placed in streets or allowing narrower streets to be used.

Inline GSG RF Tester

As noted above, the various ICs formed on the wafer are typically arranged in a grid pattern and are thus separated by vertical and horizontal streets, typically about 100 μm wide. These are used as a saw grid to saw apart or dice the various ICs after the ICs are formed in the wafer. A conventional tester that can fit between normal 100 μm wide streets is unable to measure high-frequency parameters such as S-parameters. The street-corner GS tester described above may be used with 100 μm but is limited to the corner locations, and moreover is not a GSG type tester.

On the other hand, a conventional GSG RF tester, such as device monitor 500 of FIG. 5, can measure some high frequency parameters, but is typically too large to fit into the streets, and must be placed in a special region outside of the streets and chips, unless the streets are widened. Either solution wastes wafer surface area. One reason for the large size of a conventional GSG tester 500 is that it requires four ground terminals due to the EM fields coming toward the device. If a single-sided G structure (i.e., a GS tester) is used, the width can be reduced but at the cost of the reduced test accuracy that results from the asymmetry in such GS device monitors. Using two G pads per port allows more accurate measurements, at higher frequencies, because it more accurately represents the characteristics of the coaxial cables used for the microprobes.

In the present invention, a wafer is configured for in-process electrical testing, at high frequencies (RF), of electrical components situated thereon, by use of one or more inline RF testers. In one embodiment, an inline GSG RF grid tester or device-monitor is provided. The inline GSG RF-device monitor of the present invention permits the high-frequency (RF) measurement of various parameters of sample or target components. For example, the inline GSG RF tester may be used make RF measurements using S-parameters. S-parameters are used to extract the cutoff frequency of active devices on production wafers. S-parameters are measured by injecting RF power into the target device via the tester ports, and measuring how much power is reflected back. Once S-parameters are measured, conclusions about the quality of the device under test may be derived, as will be appreciated.

Figure 6:
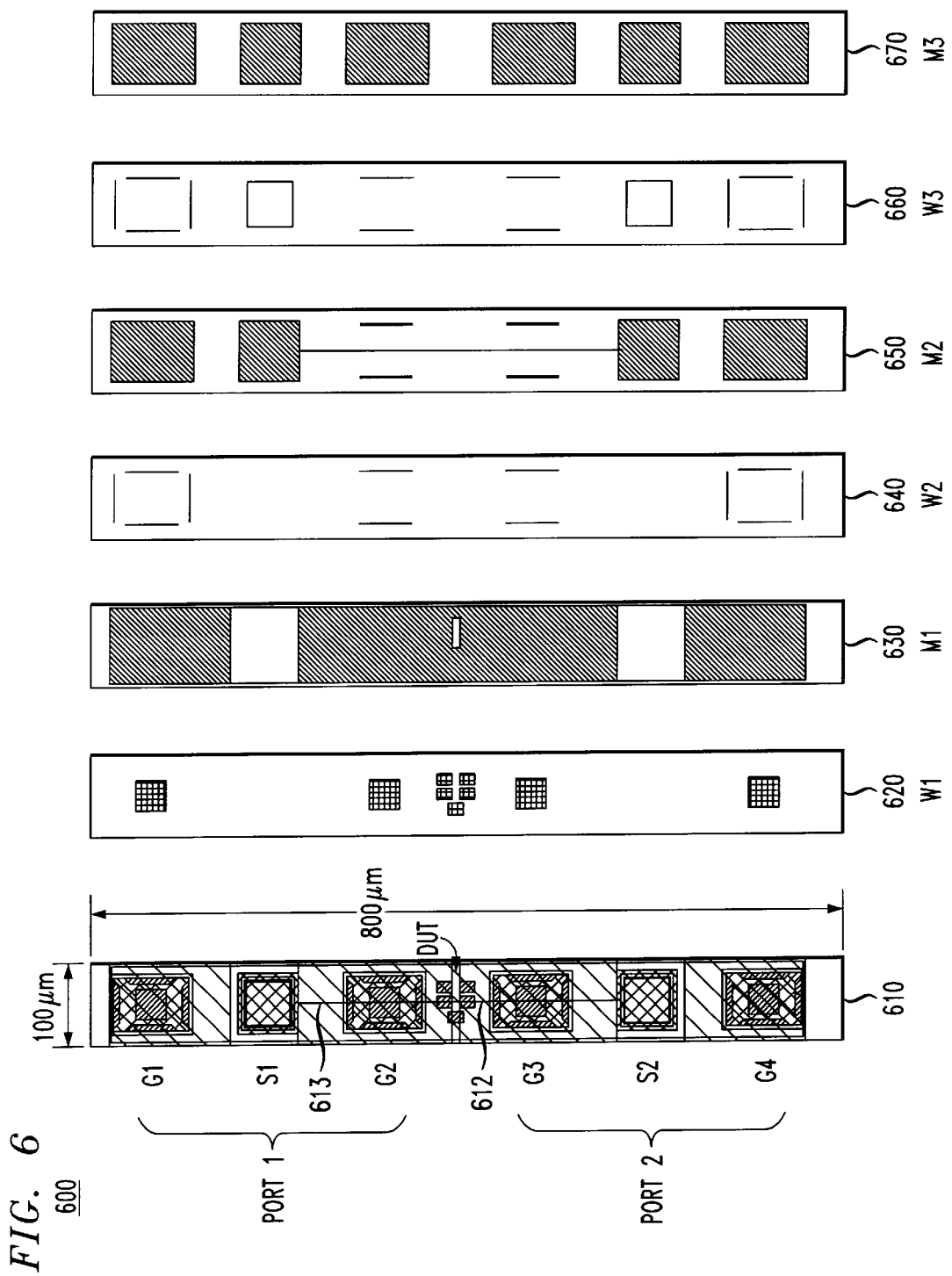
FIG. 6 shows several illustrative views of an inline GSG RF-device monitor, in accordance with an embodiment of the present invention.

Referring now to FIG. 6, there are shown several views of an inline GSG RF-device monitor or tester 600, in accordance with an embodiment of the present invention. View 610 shows all levels of the composite structure of tester 600. An input port, port 1, comprises three in-line GSG pads G1, S1, G2. The output port, port 2, comprises three in-line GSG pads G3, S2, G4. The device-under-test (DUT) is also located inline with and in between these two ports. The DUT may be, for example, a bipolar junction transistor having E, B, and C terminals.

Because each port has symmetrical GSG pads, the asymmetry of GS testers and the resulting undesirable effects are avoided. Further, GSG tester 600, in an embodiment, employs microstrip and stripline waveguides having a uniform and desired characteristic impedance to further improve the accuracy and performance of the tester. Every structure which is capable of propagating RF or high frequency signals may be characterized by its impedance. The impedance of the coaxial cable and microprobes used to couple to the pads of tester 600 is typically 50 Ω. It is desirable to configure a tester such that this same 50 Ω characteristic is maintained all the way from the microprobes to the DUT. By maintaining this desired characteristic impedance, the accuracy of the S-parameter measurements obtained is improved over even other GSG RF testers (such as conventional GSG tester 500) that do not maintain such a characteristic impedance. By using a properly configured waveguide, such as a microstrip or microstrip/stripline combination, the desired characteristic impedance is maintained.

For an inline GSG tester 600, a three-metal process is used to provide three metal layers to provide the desired interconnection of the pads and DUT terminals, to provide adequate shielding, and to provide the uniform characteristic impedance waveguides. Thus, in an embodiment, the metal layers are configured to provide waveguides that helps to maintain a desired characteristic impedance from the two signal pads $S_1$, $S_2$ to the DUT, which matches the characteristic impedance of the microprobes, probe cables, and external test equipment. This characteristic impedance matching helps further improve the accuracy of the S-parameter and RF measurements obtained by performing measurements using GSG tester 600. The electrical connections between the port pads and DUT of tester 600 are similar to those of conventional GSG tester 500, but require three layers of metals because the six pads and DUT are inline and because of the microstrip/stripline waveguides employed to maintain uniform characteristic impedance.

As illustrated in FIG. 6, ground pads $G_1$, $G_2$, $G_3$, $G_4$ are connected together via the ground plane formed by metal layer 1 (M1). Each signal pad $S_1$, $S_2$ is electrically connected to the desired terminal of the DUT by a narrow strip of metal 613, 612 respectively from metal layer 2 (M2). Each strip of metal, in combination with the metal 1 layer below and/or metal 3 layer above, forms a waveguide. Each waveguide is configured so that it provides a uniform and desired characteristic impedance all the way from the respective signal pad to the DUT. Narrow transmission line 613, for example, extends from signal pad $S_1$ to a terminal (e.g., the collector or emitter terminal) of the DUT. It is straight so that reflections are minimized. Strip 613 passes for its entire length over metal of the metal 1 groundplane. However, because tester 600 is in-line, a straight metal strip has to pass beneath the metal 3 layer portion of ground pad $G_2$. In the first and third portions of strip 613, between signal pad $S_1$ and ground pad $G_2$, and between ground pad $G_2$ and the DUT, the strip line, in combination with the metal 1 groundplane beneath it, forms a microstrip waveguide. However, in a middle or second portion, strip 613 passes between metal of the metal 1 groundplane and the metal 3 layer portion of ground pad $G_2$. Thus, the strip is at this section sandwiched between two metal or conducting ground planes, and thus forms here a so-called stripline waveguide.

The characteristic impedance of the waveguide formed with respect to metal strip 613 along its length depends in part upon its width, and in part upon whether it is above a single ground plane (the first and third "microstrip waveguide" portions) or between two ground planes (the center "stripline waveguide" portion). Accordingly, to prevent a change in the characteristic impedance at the transition from microstrip waveguide to stripline waveguide and vice-versa, and to maintain a uniform characteristic impedance along the entire length of the waveguide associated with the metal or conducting strip 613, its width is varied at the center portion to compensate for said transition. In particular, the strip 613 is wider at the center, "stripline waveguide" portion and comparatively narrower at the first and third "microstrip waveguide" portions. Thus, the dimensions of lines 613, 612 are appropriately adjusted, so that the 50 Ω characteristic impedance is maintained throughout the structure. Microstrip and stripline waveguides are described in commonly-owned U.S. patent application Ser. No. 09/243,377, filed Feb. 1, 1999, entitled "Integrated Circuit Comprising Means for High Frequency Signal Transmission" (the '377 application), the entirety of which is incorporated herein by reference.

View 620 shows the first window level (W1), which is a dielectric layer on top of the silicon substrate, which itself contains the DUT. First window level W1 is used to connect the metal 1 groundplane to the silicon substrate in specified "windows". The metal 1 ground plane level (M1), which is on top of the first window level W1, is shown in view 630. The metal 1 ground plane serves as a shield and connects the ground pads $G_1$, $G_2$, $G_3$, and $G_4$ together, while having gaps beneath the signal pads $S_1$, $S_2$ and around the DUT.

View 640 shows the window 2 level (W2), which is another dielectric layer, between the metal 1 and metal 2 layers. This layer is used to connect metal at the metal 1 layer to metal at the metal 2 layer. View 650 shows the metal 2 level (M2), including the conducting strips 613, 612 connecting the signal pads $S_1$ of port 1 and $S_2$ of port 2 to the appropriate DUT terminals. The metal 2 level contains the signal pads $S_1$, $S_2$, plus the narrow metal lines 613, 612 going from signal pads $S_1$, $S_2$ to the DUT. The waveguides associated with the conducting strips 613, 612 (which contain combinations of microstrip and stripline waveguides, as described above) provide a uniform characteristic impedance for high-frequency signals, from the test equipment, through the coaxial cables, to the DUT itself. This reduces the errors that must be corrected for and thus improves the accuracy of the measurements.

View 660 shows the window 3 level (W3), which is used to connect metal 2 to metal 3; and view 670 shows the metal 3 or top level (M3) used for the probes to contact.

Thus, as shown in FIG. 6, tester 600 comprises six contact pads (two groups of GSG pads) placed inline or colinear with each other; and a target device DUT. Each of the six contact pads is 75×75 μm in area, in an embodiment. The six pads are inline and may thus be placed in a single row (of a horizontal street) or a single column (of a vertical street). Accordingly, in the linear arrangement used in inline GSG RF tester 600, the DUT is connected to the signal pads S using 50 Ω microstrip/stripline waveguides formed by metals 1, 2, and 3, and inter-metal dielectrics of the IC, as shown in the various views of the tester 600 in FIG. 6, as described above.

In the present invention, the three metal layers 1, 2, and 3 are used to properly interconnect the input and output port pads to one another and to the DUT, and also to form a microstrip/stripline type waveguide between the signal pads $S_1$, $S_2$ and the DUT. In alternative embodiments, other types of waveguides may be used, so long as the waveguide maintains the desired uniform characteristic impedance of the transmission line, and preferably minimizes reflections by being straights.

Thus, pads $G_1$, $S_1$, and $G_2$ form the input port (port 1) of tester 600, and pads $G_3$, $S_2$, and $G_4$ form the output port (port 2). Both ports are 50 Ω characteristic impedance coplanar waveguide transmission lines, where pads $S_1$, $S_2$ are the signal pads. In use, test signals are propagated from the signal pads to the DUT via the uniform characteristic impedance waveguides of the present invention. Open and short circuit standards may be used in conjunction with inline GSG RF tester 600 for subsequent de-embedding of the measured data, as will be appreciated.

GSG RF tester 600 may be used in both production and development. At high frequencies, active devices and microstrip lines can be accurately characterized using the S-parameters. To measure the S-parameters of the DUT, two three-pin GSG microprobes are utilized to contact the respective pads of ports 1 and 2, as will be appreciated. These two microprobes are used to channel external power to the DUT. The DUT is typically biased by applying DC bias voltages to the signal pins S1, S2. Thereafter, signals are applied to go through a typical S-parameter measurement sequence. Thus, first an AC signal (RF power) is injected into signal pad S1 of the input port, and the power injected is measured, as well as the power reflected and appearing on signal pad S2 of the output port. As noted above, the measured S-parameters may then be used to determine parameters such as the cutoff frequency of the DUT, if it is an active device, or to otherwise characterize and determine the response of the DUT.

In an embodiment, the length of the inline tester 600 is about 800 μm and its total width is about 100 μm, so that it fits in 100 μm wide streets. Thus, because the structure of tester 600 is inline, i.e. its contact pads and the DUT are inline, it can fit entirely within the narrow street between chips on production wafers, and occupies less area than conventional GSG RF testers such as tester 500 of FIG. 5, thus reducing the amount of wafer surface required for testing purposes. GSG RF tester 600 is narrower than previous GSG testers such as GSG tester 500 and also narrower than previous GS testers such as the GS testers of FIGS. 3, 4. The inline GSG tester 600 also has more flexibility in terms of placement than a street corner GS tester as shown in FIG. 4.

The present invention also facilitates automated RF testing and provides increased accuracy of the measured data due to impedance matching and reduced parasitics. The present invention may be utilized for wafer testing of transistors or ICs in both production and development of ICs. The tester of the present invention also provides increased frequency range of operation over other testers. It is more accurate and has a higher frequency range than low frequency testers and GS testers, yet can still fit in narrow streets. The inline GSG RF tester of the present invention is even more accurate than wider, conventional GSG testers such as GSG tester 500, because of the inclusion of the microstrip waveguide.

In an alternative embodiment, an inline GSG tester is employed, without the use of the characteristic impedance waveguides described above. This would permit a single-metal process to be employed, for example, but at the cost of reduced accuracy because the desired characteristic impedance would not be provided.

In an alternative embodiment, ground pads $G_2$ and $G_3$ are omitted, to form an inline GS RF tester. Although such an RF tester may not be as accurate as the symmetrical layout GSG RF tester 600, it will be shorter in length and will still be an improvement over prior art GS RF testers because it is inline and thus narrower, and because it can employ the uniform characteristic impedance waveguide described above. For an inline GS RF tester, a microstrip waveguide having a uniform characteristic impedance may be formed using only two metal layers instead of three, as will be appreciated.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A wafer configured for in-process testing of electrical components, comprising:
   a plurality of dies disposed on the wafer, wherein adjacent dies are separated from one another by streets; and
   an in-line RF-device monitor having an input port having an input signal pad and at least a first input probe ground pad, an output port having an output signal pad and at least a first output port ground pad, and a device-under-test, wherein the input signal pad, the first input probe ground pad, the output signal pad, the first output port ground pad and the device-under-test are substantially in line with one another, the device-under-test is between the input and output ports and is electrically coupled to the input and output ports, and the RF-device monitor is placed within a street.

2. The wafer of claim 1, wherein at least one of the dies is an integrated circuit consisting of electrical components and the device-under-test of the device monitor is similar to one of the electrical components of the integrated circuit.

3. The wafer of claim 1, wherein a first group of the streets is substantially orthogonal to a second group of the streets.

4. The wafer of claim 1, wherein the RF-device monitor has a ground-signal (GS) configuration.

5. The wafer of claim 1, further comprising first and second waveguides for coupling the input and output ports, respectively, to the device-under-test, wherein each waveguide comprises a narrow metal line and has a substantially uniform characteristic impedance.

6. The wafer of claim 5, wherein the characteristic impedance of the waveguides is selected to be substantially equal to the characteristic impedance of microprobes and associated coaxial cables used to couple the device monitor to an external testing device.

7. The wafer of claim 1, wherein:
the RF-device monitor has a ground-signal-ground (GSG) configuration;
the input port further comprises a second input probe ground pad substantially in line with the input signal pad and the first input probe ground pad, wherein the input signal pad is between the first and second input probe ground pads; and
the output port further comprises a second output port or ground pad substantially in line with the output signal pad and the first output port ground pad, wherein the output signal pad is between the first and second output port ground pads.

8. The wafer of claim 7, further comprising first and second waveguides for coupling the input and output signal pads, respectively, to the device-under-test, wherein each waveguide comprises a narrow metal waveguide line and has a substantially uniform characteristic impedance.

9. The wafer of claim 8, wherein:
said device monitor is formed via a three-metal process in which a first metal layer provides a ground plane which couples together the input and output probe grounding pads, wherein the ground plane has gaps beneath the signal pads and around the device-under-test; a second metal layer provides the two narrow metal waveguide lines; and a third metal layer provides a top contact layer for each of said pads;
each narrow metal waveguide line extends from its respective signal pad, beneath an inside probe grounding pad nearest to said device-under-test, and to the device-under test; and
each narrow metal waveguide line comprises a central stripline waveguide portion where said waveguide line lies between the ground plane of the first metal layer and the inside probe grounding pad and comprises microstrip waveguide portions where said waveguide line lies above the ground plane of the first metal layer but not below the inside probe grounding pad.

10. The wafer of claim 9, wherein the dimensions of the narrow metal waveguide lines are adjusted to achieve the substantially uniform characteristic impedance.

11. The wafer of claim 10, wherein the narrow metal waveguide lines are comparatively wider at the central stripline waveguide portion than in the microstrip waveguide portions thereof.

12. The wafer of claim 1, wherein said streets have a width of about 100 microns and said ports comprise signal and ground pads having a width of less than about 100 microns.

13. A method of forming a wafer configured for in-process electrical testing, the wafer having a plurality of dies disposed on the wafer, wherein adjacent dies are separated from one another by streets, the method comprising the step of:
forming within a street an in-line RF-device monitor having an input port having an input signal pad and at least a first input probe ground pad, an output port having an output signal pad and at least a first output port ground pad, and a device-under-test, wherein the input signal pad, the first input probe ground pad, the output signal pad, the first output port ground pad and the device-under-test are substantially in line with one another, the device-under-test is between the Wait and output ports and is electrically coupled to the input and output ports.

14. The method of claim 13, wherein at least one of the dies is an integrated circuit consisting of electrical components and the device-under-test of the device monitor is similar to one of the electrical components of the integrated circuit.

15. The method of claim 13, wherein a first group of the streets is substantially orthogonal to a second group of the streets.

16. The method of claim 13, wherein the RF-device monitor has a ground-signal (GS) configuration.

17. The method of claim 13, wherein the in-line device monitor comprises first and second waveguides for coupling the input and output ports, respectively, to the device-under-test, wherein each waveguide comprises a narrow metal line and has a substantially uniform characteristic impedance.

18. The method of claim 17, wherein the characteristic impedance of the waveguides is selected to be substantially equal to the characteristic impedance of microprobes and associated coaxial cables used to couple the device monitor to an external testing device.

19. The method of claim 13, wherein:
the RF-device monitor has a ground-signal-ground (GSG) configuration;
the input port further comprises a second input probe ground pad substantially in line with the input signal pad and the first input probe ground pad, wherein the input signal pad is between the first and second input probe ground pads; and
the output port further comprises a second output port ground pad substantially in line with the output signal pad and the first output port ground pad, wherein the output signal pad is between the first and second output port ground pads.

20. The method of claim 19, wherein the device monitor farther comprises first and second waveguides for coupling the input and output signal pads, respectively, to the device-under-test, wherein each waveguide comprises a narrow metal waveguide line and has a substantially uniform characteristic impedance.

21. The method of claim 20, wherein:
said step of forming comprises the step of forming said device monitor via a three-metal process in which a first metal layer provides a ground plane which couples together the input and output probe grounding pads, wherein the ground plane has gaps beneath the signal pads and around the device-under-test; a second metal layer provides the two narrow metal waveguide lines; and a third metal layer provides a top contact layer for each of said pads;
each narrow metal waveguide line extends from its respective signal pad, beneath an inside probe grounding pad nearest to said device-under-test, and to the device-under test; and
each narrow metal waveguide line comprises a central stripline waveguide portion where said waveguide line lies between the ground plane of the first metal layer and the inside probe grounding pad and comprises microstrip waveguide portions where said waveguide line lies above the ground plane of the first metal layer but not below the inside probe grounding pad.

22. The method of claim 21, wherein the narrow metal waveguide lines are comparatively wider at the central stripline waveguide portion than in the microstrip waveguide portions thereof to achieve the substantially uniform characteristic impedance.

23. A wafer configured for in-process testing of electrical components, comprising:

a plurality of dies disposed on the wafer, wherein adjacent dies are separated from one another by streets;

an in-line device monitor having a first port, a second port, and a device-under-test substantially in line with one another, wherein: the device-under-test is between the first and second ports and is electrically coupled to the first and second ports, and the device monitor is placed within a street, wherein the device monitor is an RF-device monitor with ground-signal-ground (GSG) configuration, wherein the first port is an input port having an input signal pad between two input probe grounding pads and the second port is an output port having an output signal pad between two output port grounding pads; and first and second waveguides for coupling the input and output signal pads, respectively, to the device-under-test, wherein each waveguide comprises a narrow metal waveguide line and has a substantially uniform characteristic impedance, wherein:

said device monitor is formed via a three-metal process in which a first metal layer provides a ground plane which couples together the input and output probe grounding pads, wherein the ground plane has gaps beneath the signal pads and around the device-under-test; a second metal layer provides the two narrow metal waveguide lines; and a third metal layer provides a top contact layer for each of said pads;

each narrow metal waveguide line extends from its respective signal pad, beneath an inside probe grounding pad nearest to said device-under-test, and to the device-under test; and each narrow metal waveguide line comprises a central stripline waveguide portion where said waveguide line lies between the ground plane of the first metal layer and the inside probe grounding pad and comprises microstrip waveguide portions where said waveguide line lies above the ground plane of the first metal layer but not below the inside probe grounding pad.

24. The wafer of claim 23, wherein the dimensions of the narrow metal waveguide lines are adjusted to achieve the substantially uniform characteristic impedance.

25. The wafer of claim 24, wherein the narrow metal waveguide lines are comparatively wider at the central stripline waveguide portion than in the microstrip waveguide portions thereof.

26. A method for forming a wafer configured for in-process electrical testing, the wafer having a plurality of dies disposed on the wafer, wherein adjacent dies are separated from one another by streets, the method comprising the step of:

forming within a street an in-line device monitor having a first port, a second port, and a device-under-test substantially in line with one another, wherein the device-under-test is between the first and second ports and is electrically coupled to the first and second ports, wherein said device monitor is formed via a three-metal process in which a first metal layer provides a ground plane which couples together the input and output probe grounding pads, wherein the ground plane has gaps beneath the signal pads and around the device-under-test; a second metal layer provides the two narrow metal waveguide lines; and a third metal layer provides a top contact layer for each of said pads, wherein:

the device monitor is an RF-device monitor with ground-signal-ground (GSG) configuration, wherein the first port is an input port having an input signal pad between two input probe grounding pads and the second port is an output port having an output signal pad between two output port grounding pads;

the device monitor further comprises first and second waveguides for coupling the input and output signal pads, respectively, to the device-under-test, wherein each waveguide comprises a narrow metal waveguide line and has a substantially uniform characteristic impedance;

each narrow metal waveguide line extends from its respective signal pad, beneath an inside probe grounding pad nearest to said device-under-test, and to the device-under test; and each narrow metal waveguide line comprises a central stripline waveguide portion where said waveguide line lies between the ground plane of the first metal layer and the inside probe grounding pad and comprises microstrip waveguide portions where said waveguide line lies above the ground plane of the first metal layer but not below the inside probe grounding pad.

27. The method of claim 26, wherein the narrow metal waveguide lines are comparatively wider at the central stripline waveguide portion than in the microstrip waveguide portions thereof to achieve the substantially uniform characteristic impedance.

* * * * *

UNITED STATES PATENT AND TRADEMARK OFFICE
CERTIFICATE OF CORRECTION

PATENT NO. : 6,194,739 B1
DATED : February 27, 2001
INVENTOR(S) : Tony G. Ivanov and Michael Scott Carroll It is certified that error appears in the above-identified patent and that said Letters Patent is hereby corrected as shown below:

Column 12,
Line 1, delete "Wait" and insert therefor -- input --.

Signed and Sealed this

Fifteenth Day of January, 2002

Attest:

JAMES E. ROGAN
*Director of the United States Patent and Trademark Office*

*Attesting Officer*